United States Patent
Goodman et al.

(10) Patent No.: US 7,350,290 B2
(45) Date of Patent: Apr. 1, 2008

(54) COMPRESSION DEVICE FOR INTEGRATED CIRCUIT PACKAGES

(75) Inventors: Glenn Goodman, Cumberland, RI (US); Gary D. Eastman, North Kingstown, RI (US); Alfred J. Langon, Cranston, RI (US); Erol D. Saydam, Foster, RI (US)

(73) Assignee: Advanced Interconnections Corporation, West Warwick, RI (US)

( * ) Notice: Subject to any disclaimer, the term of this patent is extended or adjusted under 35 U.S.C. 154(b) by 47 days.

(21) Appl. No.: 10/987,246

(22) Filed: Nov. 12, 2004

(65) Prior Publication Data

US 2006/0101637 A1 May 18, 2006

(51) Int. Cl.
*H05K 13/04* (2006.01)

(52) U.S. Cl. .............................. 29/764; 29/741; 439/73; 439/331

(58) Field of Classification Search .......... 29/758–764, 29/253, 278, 426.1, 426.5, 729; 439/73, 439/330–331, 940; 294/15
See application file for complete search history.

(56) References Cited

U.S. PATENT DOCUMENTS

| | | | |
|---|---|---|---|
| 4,979,287 A * | 12/1990 | Schwab et al. | 29/764 |
| 5,127,837 A * | 7/1992 | Shah et al. | 439/71 |
| 5,468,158 A * | 11/1995 | Roebuck et al. | 439/264 |
| 5,469,330 A | 11/1995 | Karabatsos et al. | |
| 5,646,447 A | 7/1997 | Ramsey et al. | |
| 5,647,756 A | 7/1997 | Twigg et al. | |
| 5,671,121 A | 9/1997 | McMahon | |
| 5,734,555 A | 3/1998 | McMahon | |
| 5,741,141 A | 4/1998 | O'Malley et al. | |
| 5,766,022 A | 6/1998 | Chapin et al. | |
| 5,877,554 A | 3/1999 | Murphy et al. | |
| 5,917,703 A | 6/1999 | Murphy | |
| 5,919,050 A * | 7/1999 | Kehley et al. | 439/71 |
| 5,997,316 A | 12/1999 | Kunzel et al. | |
| 6,020,635 A | 2/2000 | Murphy et al. | |
| 6,021,045 A | 2/2000 | Johnson | |
| 6,061,235 A | 5/2000 | Cromwell et al. | |
| 6,191,480 B1 | 2/2001 | Kastberg et al. | |
| 6,198,630 B1 | 3/2001 | Cromwell | |
| 6,213,787 B1 | 4/2001 | Murphy | |
| 6,236,569 B1 | 5/2001 | McEuen | |

(Continued)

FOREIGN PATENT DOCUMENTS

EP 0 695 943 A2 2/1996

*Primary Examiner*—Minh Trinh
(74) *Attorney, Agent, or Firm*—Occhiuti Rohlicek & Tsao LLP

(57) ABSTRACT

A compression device has a frame sized to accept an integrated circuit package and a pressor. The frame includes a surface defining an opening with an axis and at least one ramp extending from the surface. The ramp or ramps have upper and lower flat portions, substantially parallel with a plane perpendicular to the axis, and a sloped portion at an angle relative to the plane, the sloped portion connecting the upper and lower flat portions. The pressor is configured to engage the ramp and rotate in response to applied force. When the pressor is engaged with the sloped portion(s) of the ramp(s), this rotation causes movement of the pressor along the axis. However, when engagement between the ramps and the pressor is in the flat portions of the ramp, continued movement of the pressor along the axis is limited in spite of any continued rotation.

10 Claims, 3 Drawing Sheets

U.S. PATENT DOCUMENTS

| | | |
|---|---|---|
| 6,325,280 B1 | 12/2001 | Murphy |
| 6,449,155 B1 | 9/2002 | Colbert et al. |
| 6,462,951 B2 | 10/2002 | Letourneau |
| 6,529,378 B2 | 3/2003 | Wong et al. |
| 6,563,213 B1 | 5/2003 | Wong et al. |
| 6,860,001 B2 * | 3/2005 | Henghuber ................ 29/729 |

* cited by examiner

COMPRESSION DEVICE FOR INTEGRATED CIRCUIT PACKAGES

TECHNICAL FIELD

This invention relates to making connections between integrated circuit (IC) array packages and circuit boards, and more particularly to making temporary connections between IC array packages and circuit boards.

BACKGROUND

Ball grid array (BGA) and land grid array (LGA) packages are becoming increasingly popular because of their low profiles and high densities. With a BGA package, for example, the rounded solder balls of the BGA are generally soldered directly to corresponding surface mount pads of a printed circuit board rather than to plated thru-holes which receive pins from, for example, a pin grid array (PGA) IC package.

Sockets allow particular IC packages to be interchanged without permanent connection to a circuit board. More recently, sockets for use with BGA and LGA packages have been developed to allow these packages to be non-permanently connected (e.g., for testing) to a circuit board. However, problems can exist in attaching a BGA package to sockets using conventional compression devices that are subject to misuse. In some instances, users under-compress IC packages so that adequate contact is not made between the package and the socket. In other instances, users damage IC packages by over-compressing them in an attempt to compensate for the first problem.

SUMMARY

This invention features a compression device for a socket terminal assembly. The socket terminal assembly provides a reliable, non-permanent and low-loss electrical interconnection between electrical contacting areas of an array package and connection regions of a substrate (e.g., printed circuit board) while duplicating the mating condition normally present between the electrical contacting areas and connection regions. The compression device allows users to adequately compress the array package to make electrical connections required for purposes such as testing, without damaging the array package through over-compression. The term "integrated circuit array package" is intended to mean those packages, including PGA, BGA and LGA packages. The term "substrate" is intended to mean any base member having electrical contact areas including printed circuit boards, IC chip substrates or the packages supporting such chip substrates.

In one aspect of the invention, a compression device has a frame sized to accept an IC package including a surface defining an opening with an axis and at least one ramp extending from the surface. The ramp or ramps have upper and lower flat portions, substantially parallel with a plane perpendicular to the axis, and a sloped portion at an angle relative to the plane, the sloped portion connecting the upper and lower flat portions. The compression device also includes a pressor configured to engage the ramp and rotate in response to applied force wherein movement of the pressor along the axis is caused by such rotation when engagement between the ramps and the pressor is in the sloped portion of the ramps and continued movement of the pressor along the axis is limited when engagement between the ramps and the combined unit is in the flat portions of the ramp. Among other advantages, when the pressor is engaged with the sloped portion(s) of the ramp(s), this rotation causes movement of the pressor along the axis. However, when engagement between the ramps and the pressor is in the flat portions of the ramp, continued movement of the pressor along the axis is limited despite any continued rotation of the pressor.

In another aspect of the invention, a compression device has a frame sized to accept an IC package including a surface defining an opening with an axis and two ramps extending from the surface. The ramps each comprise upper and lower flat portions, that are substantially parallel with a plane perpendicular to the axis, and a sloped portion at an angle relative to the plane, the sloped portion connecting the upper and lower flat portions. The compression device also includes an actuator engaging the upper surfaces of the ramps and a pressor engaging lower surfaces of the ramps. The pressor is attached to the actuator so that rotation of the actuator rotates the pressor inducing movement of the pressor along the axis.

In another aspect, a compression device has a guide box having an interior cavity defined by walls, the interior cavity sized to accept an integrated circuit package. The compression device also has a lid attached to the guide box by a hinge pin and springs that bias the lid towards remaining in an open position relative to the guide box. The lid has a surface defining an opening with an axis; and two ramps extending from the surface with the ramps disposed symmetrically on opposing sides of the surface defining the opening. The ramps each comprise upper and lower flat portions, that are substantially parallel with the plane, and a sloped portion at an angle relative to a plane perpendicular to the axis, the sloped portion connecting the upper and lower flat portions. The compression device also has an actuator engaging upper surfaces of the ramps and a pressor engaging lower surfaces of the ramps. The pressor is attached to the actuator so that rotation of the actuator rotates the pressor inducing movement of the pressor along the axis. The actuator and the pressor form a combined unit defining gaps, the combined unit having bearing surfaces engaging the ramps with the gaps bracketing the ramps and rotation of the combined unit moving the bearing surfaces from engagement with the upper flat portion to engagement with the lower flat portion moves the pressor a predetermined distance along the axis.

Embodiments of these aspects of the invention may include one or more of the following features. The compression device preferably has two ramps that are disposed symmetrically on opposing sides of the surface defining the opening. The compression device can also include an actuator attached to the pressor so that rotation of the actuator results in rotation of the pressor. The attached actuator and pressor form a combined unit having bearing surfaces defining gaps and engaging the ramps with the gaps bracketing the ramps. Rotation of the combined unit moving the bearing surfaces from engagement with the upper flat portion to engagement with the lower flat portion moves the pressor a predetermined distance along the axis. In some embodiments, the ramps also have end walls, extending vertically from upper and lower surfaces of the ramps, that limit rotational movement of the combined unit.

The frame of the compression device can include a guide box and a lid. The guide box has an interior cavity defined by walls and sized to accept an integrated circuit package. The lid is attached to the guide box by a hinge pin and springs that bias the lid towards remaining in an open position. In some embodiments with these features, the compression device preferably also includes a latch mounted on the lid to engage the guide box when the lid is in a closed position. This engagement between the latch and guide box maintains the lid in its closed position against opening force exerted by the springs. The compression device preferably further includes a safety release capable of locking the latch to prevent inadvertent release of engagement between the latch and the guide box. More preferably, the safety release is mechanically connected with the actuator so that rotation and counter-rotation of the actuator, respectively locks and unlocks the latch. In some embodiments, the lock is integrally molded with the actuator.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
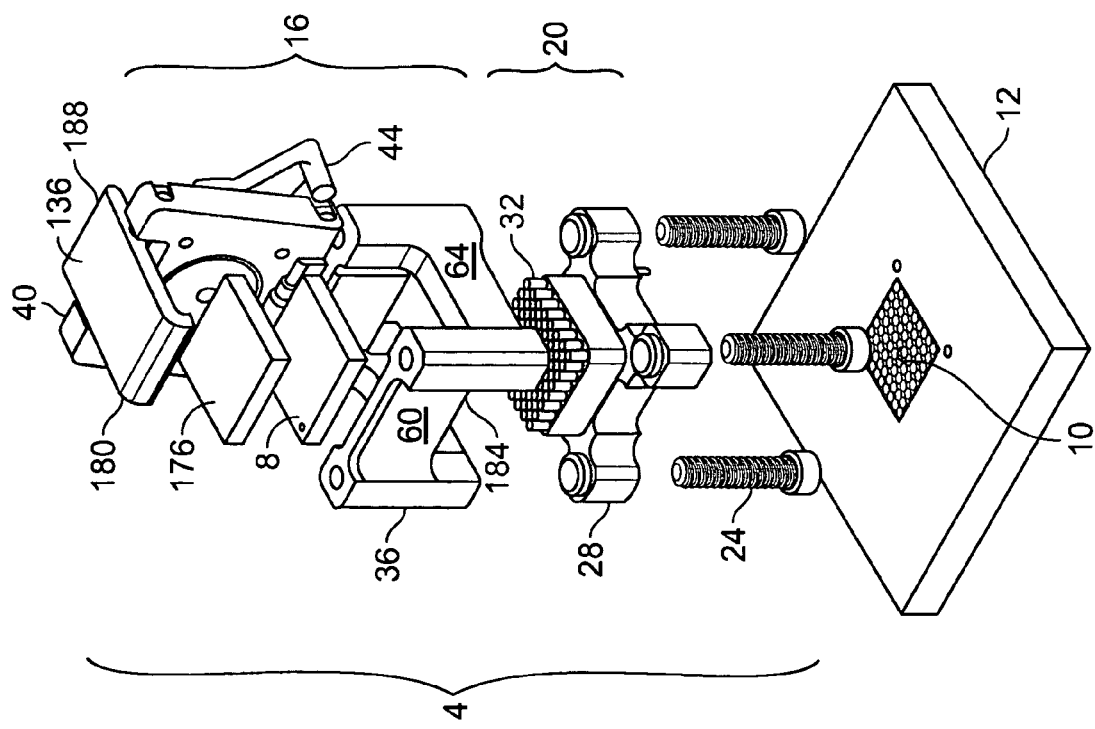
FIG. 1 is an exploded, somewhat diagrammatic view of an intercoupling component assembly, an integrated circuit package, and a support plate positioned over a printed circuit board.

Referring to FIG. 1, a socket converter assembly 4 for interconnecting a BGAIC package 8 to surface mount pads 10 of a printed circuit board 12 is shown. Socket converter assembly 4 includes an upper socket converter assembly 16 for securing IC package 8 in socket converter assembly 4. Upper socket converter assembly 16 is operable to compress IC package 8 a specified distance into engagement with lower socket converter assembly 20, which serves as an intercoupling component between IC package 8 and printed circuit board 12. Compression of IC package 8 brings rounded solder balls (not shown) attached to contacts on the undersurface of IC package 8 into contact with converter socket terminals 32 of lower socket converter assembly 20. Converter socket terminals 32 are press-fit within holes in the insulative member 28 and provide an electrical connection between these solder balls and surface mount pads 10 of the printed circuit board 12. In this embodiment, upper socket converter assembly 16 provides both (a) visual indications of when the desired amount of compression is achieved and (b) physical limits to prevent users from over-compressing IC package 8. This helps users to adequately compress IC package 8 to make the electrical connections required for purposes such as testing, without damaging IC package 8 through over-compression.

Lower socket converter assembly 20 is surface mounted to IC package 8 using solder ball attachments and supports IC package 8 and upper socket converter assembly 16. Screws 24, threaded through an electrically insulative member 28, attach upper socket converter assembly 16 to lower socket converter assembly 20. In this embodiment, electrically insulative member 28 supports converter socket terminals 32 and a guide box 36 which aligns solder balls on IC package 8 over converter socket terminals 32. Socket converter assembly 4 is of the general type described in U.S. Pat. No. 5,877,554 issued to Murphy, the details of which being hereby incorporated by reference.

Figure 2:
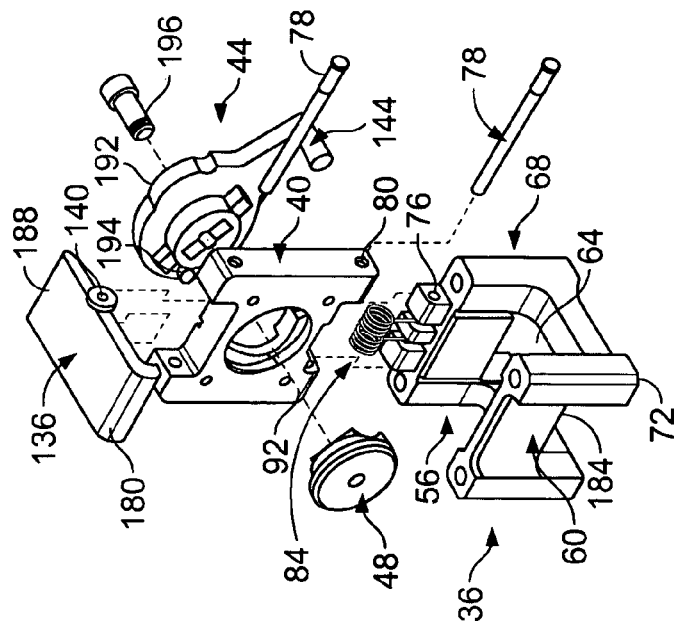
FIG. 2 is an exploded perspective view of an upper socket converter assembly that comprises the upper portion of the intercoupling component assembly shown in FIG. 1.

Referring to FIG. 2, guide box 36 supports a lid assembly including a lid 40, a compressing lever 44, and a pressor 48. Compressing lever 44 and pressor 48 are attached to one another so as to engage ramps 52 formed on an inner surface 54 of lid 40. As will be described in greater detail below, ramps 52 are configured to limit the compression that pressor 48 exerts on IC package 8 when it is placed within an interior space 56 defined by walls 60, 64, 68 and corner posts 72 of guide box 36. In this embodiment, three hinges 76 are mounted on back wall 68 of guide box 36. A pin 78 is inserted through back receiving holes 80 in lid 40, hinges 76, and rear springs 84 to attach lid 40 to guide box 36. Rear springs 84 bias lid 40 towards an open position. In other embodiments, other connectors including, but not limited to, snap fittings attach lid 40 to guide box 36.

Figure 3A:
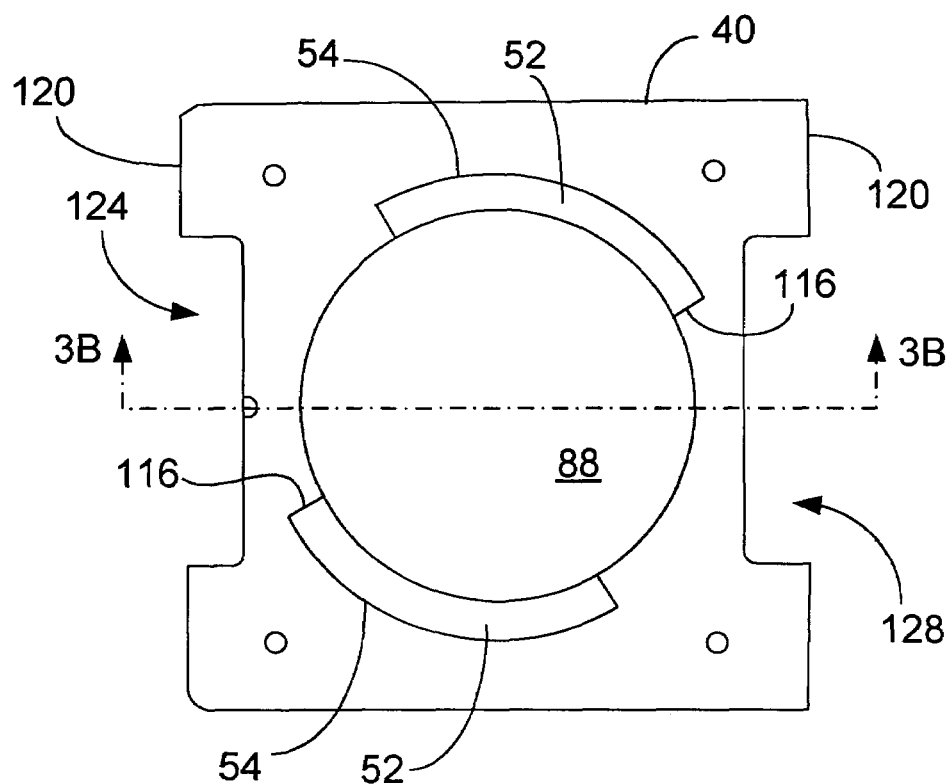
FIGS. 3A-3C are, respectively, top, cross-section, and side views of the lid shown in FIGS. 1 and 2.
Figure 3B:
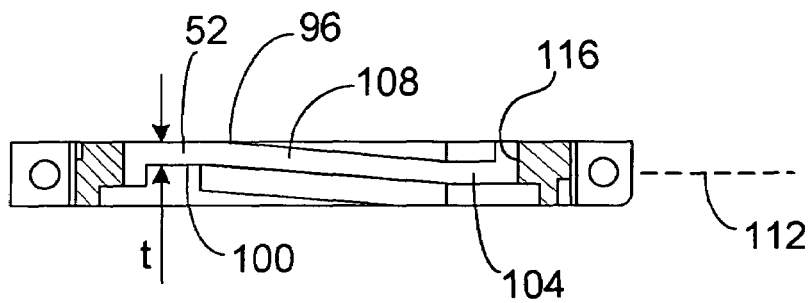
Figure 3C:
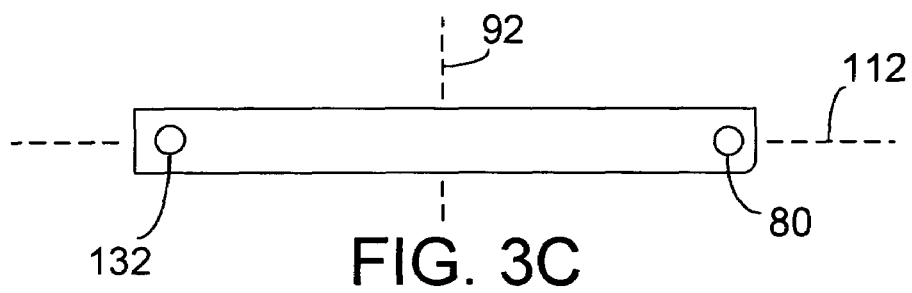

Referring to FIGS. 3A-3C, lid 40 includes a circular opening 88 with an axis 92. Opening 88 extends through lid 40 with two ramps 52 protruding from inner surface 54 of opening 88. As shown in FIG. 3B, each ramp 52 has thickness t between ramp upper surfaces 96 and ramp lower surfaces 100. Ramps 52 have a flat portion 104 on each end and sloped portions 108 extending between flat portions 104. Flat portions 104 are substantially parallel with a plane 112 perpendicular to the axis 92 while sloped portions 108 are at an angle relative to plane 112. Ramp flat portions 104 and associated ramp end walls 116 physically limit the movement of compressing lever 44 and pressor 48.

Referring to FIGS. 3A and 3C, lid 40 also has tabs 120 that define a front recess 124 and a back recess 128. Front receiving holes 132 and back receiving holes 80 extend through tabs 120 to provide attachment points on lid 40. Lid 40 is attached to guide box 36 by resting lid 40 on guide box 36 so that hinges 76 extend into back recess 128 and then inserting hinge pin 78 through back receiving holes 80, rear springs 84, and hinges 76. Similarly, latch 136 is attached to lid 40 by placing latch 136 in front recess 124 so that bore 140 is aligned with front receiving holes 132 and then inserting pin 78 through the holes 132 and bore 140.

Figure 4A:
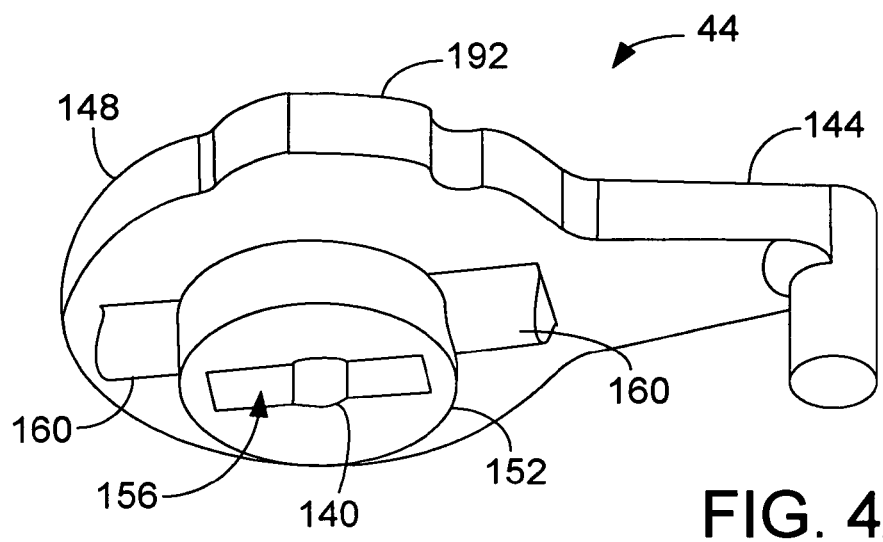
FIGS. 4A and 4B are perspective views of, respectively, the compressing lever and pressor shown in FIGS. 1 and 2.

Referring to FIG. 4A, compressing lever 44 includes an integrally molded handle 144 extending radially outward from a body 148. Body 148 has a cylindrical lower portion 152 sized to fit within opening 88 past ramps 52. Lower portion 152 defines a keyhole 156. Arched bearing surfaces 160 extend radially from lower portion 152 and are configured to fit within inner surface 54 of opening 88 and engage ramps 52.

Figure 4B:
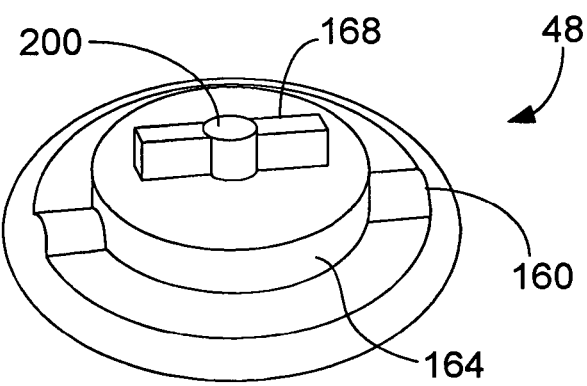
Figure 4C:
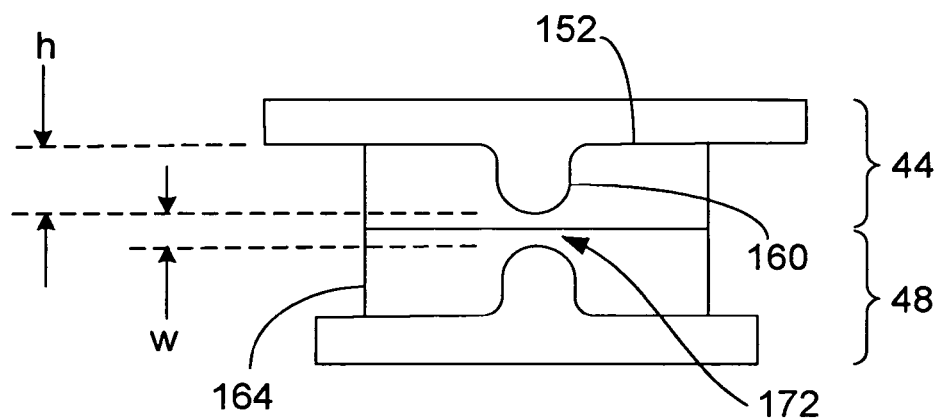
FIG. 4C is a side view of the engaged compressing lever and pressor from the side opposite the handle of the compressing lever. For clarity of illustration, these components are shown without the lid that they would be engaging.

Referring to FIG. 4B, pressor 48 has arched bearing surfaces 160 radially extending from an upper portion 164. Upper portion 164 and bearing surfaces 160 are sized so as to, respectively, fit within and engage ramps 52. Key 168, configured to fit within keyhole 156, extends axially upward from upper portion 164. When assembled, compressing lever 44 and pressor 48 are attached to each other with key 168 inserted into keyhole 156. Thus, rotation of compressing lever 44 in response to force applied to handle 144 also causes the rotation of pressor 48 due to the engagement between key 168 and keyhole 156. As shown in FIG. 4C, engagement between key 168 and keyhole 156 also aligns bearing surfaces 160 on pressor 48 with those on compressing lever 44. Bearing surfaces 160 have a height h chosen so that aligned bearing surfaces 160 define a gap 172 with a width w that is slightly larger than thickness t of ramps 52. Compressing lever 44 and pressor 48 are inserted through opposing sides of opening 88 prior to attachment so that gap 172 is formed engaging ramps 52.

To operate the socket assembly, a user inserts IC package 8 and support plate 176 into upper socket converter assembly 16 of a socket converter assembly 4 attached to printed circuit board 12. Support plate 176 distributes loads applied by action of pressor 48 substantially uniformly across the upper surface of IC package 8 and compensates for variations of IC package thickness between individual IC packages 8. The user then rotates lid 40 from the open position shown in FIG. 1 to a substantially horizontal closed position. In this position, latch 136 extends along front wall 60 with lip 180 engaging a lower edge 184 of front wall 60. The user applies a gentle pressure to overcome the resistance of rear springs 84 which bias lid 40 towards remaining in its initial open position. The user also applies a gentle pressure to latch tab 188 to rotate latch 136 about the fulcrum provided by pin 78 so as to hold lip 180 clear of front wall 60 while closing lid 40. After lid 40 reaches its closed position, user rotates lip 180 into engagement with the lower edge 184 of front wall 60. Until released by pressure applied to latch tab 188, this engagement maintains lid 40 in its closed position against the force exerted by rear springs 84.

While lid 40 is being closed, compressing lever 44 is maintained in the released position shown in FIG. 1. In this position, bearing surfaces 160 engage ramps 52 at a point where upper surfaces 96 of ramps 52 are level with the top of lid 40. The engagement between ramps 52 and bearing surfaces 160 positions pressor 48 slightly above but not contacting support plate 176. The user then uses handle 144 to rotate compressing lever 44 and, consequently, pressor 48 in the clock-wise direction. While this rotation is moving bearing surfaces 160 along sloped portions of ramps 52, the engagement between ramps 52 and bearing surfaces 160 moves pressor 48 towards and into engagement with support plate 176 and, thus, support plate compresses IC package into engagement with converter socket terminals 32. After this rotation moves bearing surfaces past sloped portions 108 to the lower flat portion 104 of ramps 52, further clockwise rotation does not provide additional compression to IC package 8 as the engagement between bearing surfaces 160 and ramps 52 maintains pressor 48 at a fixed vertical position. Moreover, contact between bearing surfaces and ramp end walls 116 limits further clockwise rotation.

Increasing numbers of pins on IC packages 8 require increasing amounts of force to achieve a desired degree of compression. Choosing ramp specifications to achieve this desired degree of compression allows users to smoothly exert the necessary force to engage IC packages 8 with converter socket terminals 32 while preventing over-compression and associated damage to IC packages being tested. For example, in an exemplary embodiment, clockwise rotation of handle 144 about 93 degrees lowers pressor 48 about 0.030 inch. The position of handle 144 provides users with a visual indication that the desired amount of compression has been achieved and ramp end walls 116 stop further clockwise rotation of the compressing lever 44 and pressor 48. In addition, compressing lever body 148 includes a lock 192. As the desired degree of compression is achieved, the user applies sufficient force to overcome the additional resistance arising as front spring 194 contacts ramp end wall 116. This allows lock 192 to engage a back side of latch tab 188 thus preventing release of latch 136 by pressure accidentally applied to the front side of latch tab 188. It is desirable to such accidental releases because the resulting sudden change in the degree of applied compression has the potential to damage IC package 8.

After testing, the user reverses the above process to release compression from IC package 8 so that it can be removed from socket converter assembly.

A number of embodiments of the invention have been described. Nevertheless, it will be understood that various modifications may be made without departing from the spirit and scope of the invention. For example, in this embodiment, a screw 196 is inserted through a first central bore 140, defined in and extending through body 148, and into a second central bore 200, defined in pressor that extends through key 168 and upper portion 164 to attach pressor 48 to compressing lever 44. First central bore 140 and second central bore 200 are aligned when key 168 is inserted in keyhole 156. However, those skilled in the art will recognize that various fasteners can be used to attach pressor 48 to compressing lever 44 while remaining within the scope and spirit of the present invention. Similarly, a LGAIC package can be used in place of the BGAIC package discussed above. Accordingly, other embodiments are within the scope of the following claims.

What is claimed is:

1. A compression device comprising:
   a frame sized to accept an integrated circuit package, the frame including a surface defining an opening with an axis and first and second ramps extending from the surface defining the opening, the first and second ramps being disposed symmetrically on opposing sides of the surface defining the opening, the each of the first and second ramps having:
   an upper flat portion substantially parallel with a plane perpendicular to the axis;
   a lower flat portion substantially parallel with the plane perpendicular to the axis, and
   a sloped portion at an angle relative to the plane perpendicular to the axis, the sloped portion connecting the upper and lower flat portions; and
   a pressor configured to engage the first and second ramps and rotate in response to applied force, wherein movement of the pressor along the axis is caused by such rotation when engagement between the first and second ramps and the pressor is in the sloped portions of the first and second ramps and continued movement of the pressor along the axis is limited when engagement between the first and second ramps and the combined unit is in the flat portions of the first and second ramps.

2. The compression device of claim 1 further comprising an actuator wherein the actuator and the pressor are attached so that rotation of the actuator results in rotation of the pressor, the actuator and the pressor forming a combined unit with bearing surfaces defining gaps, the combined unit engaging the ramps with the gaps bracketing the ramps.

3. The compression device of claim 2 wherein:
   the actuator includes a keyhole; and
   the pressor includes a key configured to engage the keyhole so that rotation of the actuator results in rotation of the pressor.

4. The compression device of claim 2 wherein rotation of the combined unit moving the bearing surfaces from engagement with the upper flat portion to engagement with the lower flat portion moves the pressor a predetermined distance along the axis.

5. The compression device of claim 4 wherein the ramps also have end walls extending vertically from upper and lower surfaces of the ramps, the end walls limiting rotational movement of the combined unit.

6. The compression device of claim 4 wherein the frame comprises:
- a guide box having an interior cavity defined by walls, the interior cavity sized to accept an integrated circuit package; and
- a lid attached to the guide box by a hinge pin and springs that bias the lid towards remaining in an open position.

7. The compression device of claim 6 further comprising a latch, the latch mounted on the lid so as to engage the guide box when the lid is in a closed position, the engagement between the latch and guide box maintaining the lid in its closed position against opening force exerted by the springs.

8. The compression device of claim 7 further comprising a safety release, the safety release capable of locking the latch to prevent inadvertent release of engagement between the latch and the guide box.

9. The compression device of claim 8 wherein the safety release is mechanically connected with the actuator so that rotation and counter-rotation of the actuator, respectively locks and unlocks the latch.

10. The compression device of claim 9 wherein the lock is integrally molded with the actuator.

* * * * *